(12) United States Patent
Schuetz

(10) Patent No.: US 9,009,423 B2
(45) Date of Patent: Apr. 14, 2015

(54) SERIALLY CONNECTED MEMORY HAVING SUBDIVIDED DATA INTERFACE

(75) Inventor: Roland Schuetz, Ottawa (CA)

(73) Assignee: NovaChips Canada Inc., Ottawa, Ontario (CA)

( * ) Notice: Subject to any disclaimer, the term of this patent is extended or adjusted under 35 U.S.C. 154(b) by 292 days.

(21) Appl. No.: 13/643,317

(22) PCT Filed: Apr. 26, 2011

(86) PCT No.: PCT/CA2011/000468
§ 371 (c)(1),
(2), (4) Date: Nov. 6, 2012

(87) PCT Pub. No.: WO2011/134051
PCT Pub. Date: Nov. 3, 2011

(65) Prior Publication Data
US 2013/0086334 A1    Apr. 4, 2013

Related U.S. Application Data

(60) Provisional application No. 61/327,807, filed on Apr. 26, 2010.

(51) Int. Cl.
*G06F 12/00* (2006.01)
*G06F 13/16* (2006.01)
*G11C 7/10* (2006.01)
*G11C 8/18* (2006.01)

(52) U.S. Cl.
CPC ............ *G06F 12/00* (2013.01); *G06F 13/1684* (2013.01); *G11C 7/10* (2013.01); *G11C 7/1003* (2013.01); *G11C 8/18* (2013.01)

(58) Field of Classification Search
USPC ......................................................... 711/154
See application file for complete search history.

(56) References Cited

U.S. PATENT DOCUMENTS 7,593,279 B2 *    9/2009    Wolford et al. ................ 365/220

* cited by examiner

*Primary Examiner* — Aracelis Ruiz
(74) *Attorney, Agent, or Firm* — Shin Hung; Borden Ladner Gervais LLP

(57) ABSTRACT

A memory system has a controller. A plurality of memory devices are serially interconnected with the controller via an n-bit data interface. The memory system is configurable in a first mode to communicate each read and write operation between the controller and the memory devices using all n bits of the data interface. The memory system is configurable in a second mode to concurrently: communicate data associated with a first operation between the controller and a first target memory device using only m bits of the data interface, where m is less than n; and communicate data associated with a second operation between the controller and a second target memory device using the remaining n-m bits of the data interface. A memory device, a memory controller, and a method are also described.

22 Claims, 11 Drawing Sheets

SERIALLY CONNECTED MEMORY HAVING SUBDIVIDED DATA INTERFACE

RELATED APPLICATION

This application is a 371 filing of International Patent Application No. PCT/CA2011/000468 filed on Apr. 26, 2011 and claims priority to U.S. Provisional Application Ser. No. 61/327,807, filed Apr. 26, 2010, both of which are incorporated by reference herein in their entirety.

FIELD OF THE INVENTION

The invention relates generally to semiconductor memory devices, and in particular to serially connected semiconductor memory devices.

BACKGROUND

Serially connected memory systems, such as HLNAND™ developed by MOSAID Technologies Inc., are configured with a data interface, sometimes called a data bus, that originates at a controller, is serially connected to a number of memory devices, typically in a daisy-chain ring, and returns to the controller. The data interface may include one or more bits, and is used to carry out both read and write operations for all of the serially connected memory devices. While this serial configuration provides a flexible and high-performance memory system, it presents a number of difficulties under some operating conditions.

When operating conditions require reading and writing to the memory system at the same time, the read and write operations contend for use of the same data interface. For example, if the write operation takes an extended period of time, the write operation must be interrupted to allow the read operation to occur, or else the read operation must be delayed while the write operation is completed. If both read and write operations are required at the same time, particularly if either or both occupies a significant portion of the data interface bandwidth, bus contention can result in significant delays and inconvenience to the user.

One solution to this problem is to truncate a write signal at the target memory device instead of propagating the write signal around the rest of the ring, thereby leaving the data interface free to carry a read signal back to the controller from either the same memory device or a downstream memory device. This method allows concurrent read and write on the same data interface of a daisy-chain memory array without bus contention, but only when the target of the read operation is downstream from the target of the write operation in the direction of data communication around the ring. The read and write may be performed on the same target device if the target device has independent input and output ports. If the read and write requests are directed to random devices in the ring, it should be understood that there is roughly a 50% probability that the controller will be able to arrange a read operation and a concurrent write operation, resulting in roughly a 50% increase in data interface bandwidth usage. Further advantages in bandwidth usage can be realized if the controller schedules read and write operations appropriately, for example by holding write requests in a queue until a read request is addressed to a downstream device and then processing the two at the same time. However, this arrangement further increases the complexity of the controller, and may require a significant amount of memory to maintain a potentially large queue. In addition, this arrangement still requires delaying some operations, which may be undesirable in some applications where continuous reading and writing may both be desired at the same time.

Therefore, there is a need for a serial memory array capable of performing concurrent read and write operations and having a simple design.

There is also a need for a serial memory array capable of performing concurrent read and write operations independently of the physical addresses of the targets of the read and write operations.

There is also a need for a method of using a single data interface to perform concurrent read and write operations on a serial memory array.

SUMMARY

It is an object of the present invention to address one or more of the disadvantages of the prior art.

It is another object of the present invention to provide a serial memory array configurable for performing concurrent read and write commands using a single data interface.

It is another object of the present invention to provide a serial memory array capable of performing concurrent read and write operations on a daisy-chain ring of serially-connected memory devices independently of the physical locations of the respective target devices of each operation.

It is another object of the present invention to provide a serial memory array configurable to subdivide the available capacity of the data interface between a write command and a concurrent read command.

In one aspect, a memory system has a controller. A plurality of memory devices are serially interconnected with the controller via an n-bit data interface. The memory system is configurable in a first mode to communicate each read and write operation between the controller and the memory devices using all n bits of the data interface. The memory system is configurable in a second mode to concurrently: communicate data associated with a first operation between the controller and a first target memory device using only m bits of the data interface, where m is less than n; and communicate data associated with a second operation between the controller and a second target memory device using the remaining n-m bits of the data interface.

In a further aspect, the first operation is a read operation. The second operation is a write operation.

In a further aspect, the second target memory device is connected downstream of the first target memory device.

In a further aspect, m and n-m are equal.

In a further aspect, the controller is further configurable in the second mode to communicate commands associated with the first and second operations on only the remaining n-m bits of the data interface.

In an additional aspect, a memory device has n data input pins for receiving data from a first external device. The memory device has n data output pins for transmitting data to a second external device. The memory device has internal logic selectively configurable to operate the memory device in one of a first mode and a second mode. When operating in the first mode, the memory device is operative to: receive data associated with a single operation on all n data input pins; and transmit data associated with a single operation on all n data output pins. When operating in the second mode, the memory device is operative to concurrently: receive data associated with a first operation on only m of the data input pins; transmit data associated with the first operation on only m of the data output pins; receive data associated with a second operation on the remaining n-m of the data input pins; and transmit data associated with the second operation on the remaining n-m of the data output pins. m is less than n.

In a further aspect, the first operation is a read operation. The second operation is a write operation.

In a further aspect, a target device of the write operation is connected downstream of the data output pins. A target device of the read operation is connected upstream of the data input pins.

In a further aspect, m and n-m are equal.

In a further aspect, the internal logic is further configurable in the second mode to receive commands associated with the first and second operations on only the remaining n-m data input pins.

In an additional aspect, a memory controller has an n-bit data interface for communicating with a plurality of serially-connected memory devices. The memory controller has internal logic configurable to operate in a first mode to communicate each read and write operation to the memory devices using all n bits of the data interface. The memory controller is configurable in a second mode to concurrently: communicate data associated with a first operation to the memory devices using only m bits of the data interface, where m is less than n; and communicate data associated with a second operation to the memory devices using the remaining n-m bits of the data interface.

In a further aspect, the first operation is a read operation. The second operation is a write operation.

In a further aspect, a target memory device of the write operation is connected downstream of a target memory device of the read operation.

In a further aspect, m and n-m are equal.

In a further aspect, the memory controller is further configurable in the second mode to communicate commands associated with the first and second operations on only the remaining n-m bits of the data interface.

In an additional aspect, a method of operating a plurality of serially-connected memory devices connected by an n-bit data interface comprises: sending a first command from a memory controller, the first command being addressed to a first target memory device; communicating data associated with the first command between the memory controller and the first target memory device on only m bits of the data interface; sending a second command from the memory controller, the second command being addressed to a second target memory device; and communicating data associated with the second command between the memory controller and the second target memory device on only the remaining n-m bits of the data interface.

In a further aspect, communicating data associated with the first command and communicating data associated with the second command are performed concurrently.

In a further aspect, communicating data associated with the first command and sending the second command are performed concurrently.

In a further aspect, the first and second commands are sent using only the remaining n-m bits of the data interface.

In a further aspect, one of the first and second commands is a read command, and the other of the first and second commands is a write command.

In a further aspect, the target memory device of the write command is connected downstream of the target memory device of the read command.

In a further aspect, m is equal to n-m.

In the present document, the term "data interface" in reference to an individual memory device or a controller should be understood to refer collectively to all of the data input and data output pins that are used for communicating read or write data to or from that device, as well as the connection of those data input and data output pins to corresponding data input/output pins of other devices. A reference to any subset of the pins of the data interface should be understood to mean both the input pins and the corresponding output pins of the data interface unless the context indicates otherwise; for example, pins 0-3 of the input data interface would not be considered distinct from pins 0-3 of the output data interface.

In the present document, the term "data interface" in reference to a memory system should be understood to refer collectively to all of the data input and output pins of all of the interconnected component memory devices and the memory controller, as well as all of the electrical connections therebetween. A reference to any subset of the pins of the data interface should be understood to mean both the input pins and the corresponding output pins of the data interface unless the context indicates otherwise; for example, pins 0-3 of the input data interface would not be considered distinct from pins 0-3 of the output data interface.

In the present document, the term "target device", with reference to a particular command or data, should be understood to refer to the memory device to which that particular command or data is addressed or directed, or from which the data is read in response to a command targeting that memory device.

Additional and/or alternative features, aspects, and advantages of embodiments of the present invention will become apparent from the following description, the accompanying drawings, and the appended claims.

DETAILED DESCRIPTION

Figure 1:
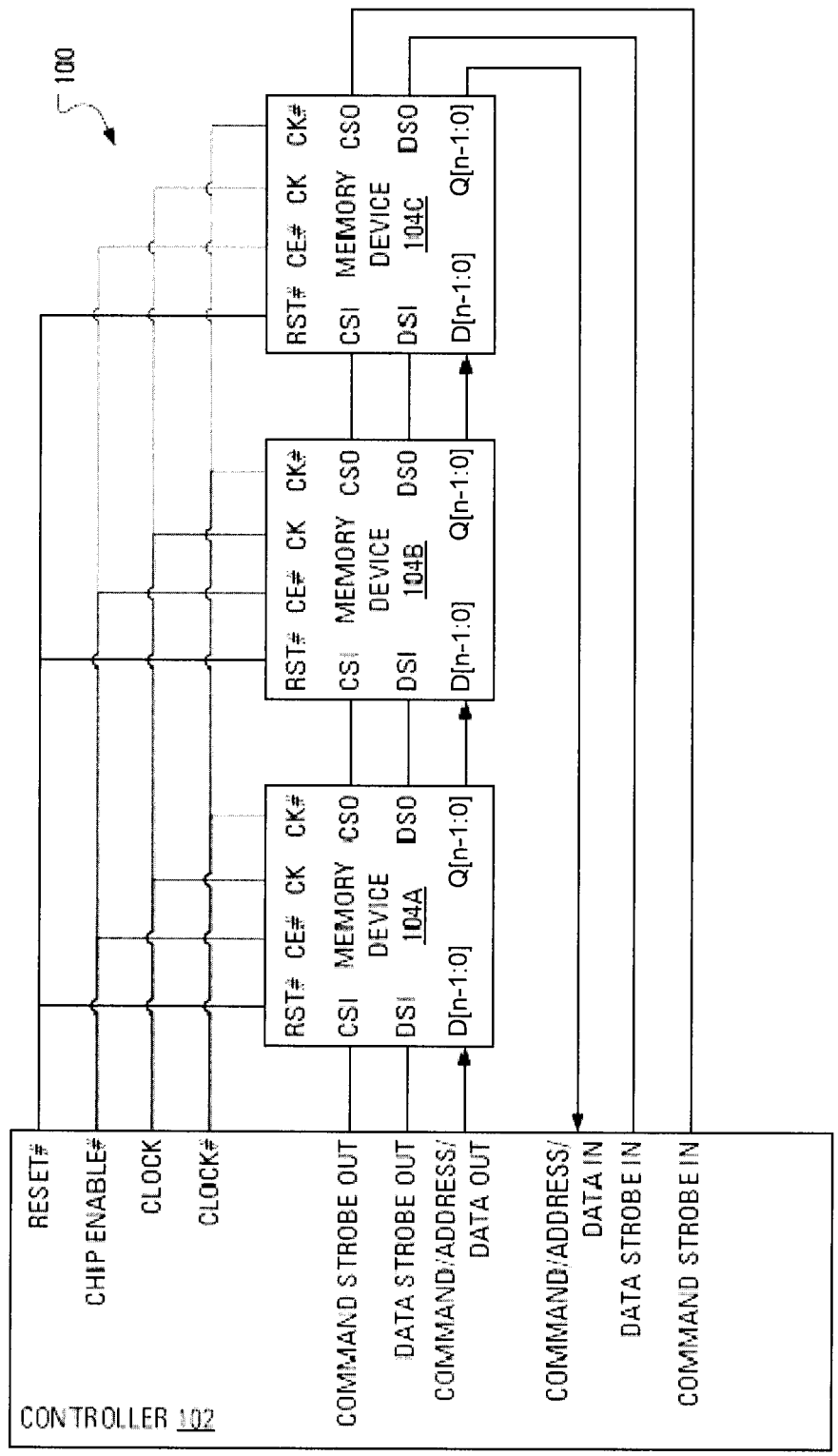
FIG. 1 illustrates a ring arrangement of memory devices configured for parallel clock distribution.

In an arrangement 100 illustrated in FIG. 1, a first memory device 104A, a second memory device 104B and a third memory device 104C (collectively or individually 104) are in a ring or loop arrangement. Operation of the memory devices 104 for writing or reading is organized by a controller 102.

The controller 102 is connected to the first memory device 104A by Command Strobe Line CSI/CSO, a Data Strobe Line DSI/DSO and an n-bit Data interface D[n-1:0]/Q[n-1:0]. The Data interface may have a fixed width of one bit, two bits, four bits, eight bits or any other number of bits, or it may have a variable width programmable within a range, for example between one bit and eight bits. Similarly, the first memory device 104A is connected to the second memory device 104B by way of a Command Strobe Line (CSI/CSO), a Data Strobe Line (DSI/DSO) and a Data interface D[n-1:0]/Q[n-1:0]. A third memory device 104C and any number of additional memory devices may be serially connected in a similar manner, with the outputs of the final downstream memory device 104 being connected to the data input port of the controller 102 to complete the ring. The controller 102 is also connected to each of the memory devices 104, in parallel, by a Reset line RST#, a Chip Enable line CE#, a Clock line CK, an inverse Clock line CK#, and any other connections that may be required. It is contemplated that only one or two memory devices, or more than three memory devices, may alternatively be used, provided that the controller is appropriately configured. Typically, up to 255 devices may be used in a single ring, depending on the particular application, or even more if the controller is appropriately configured.

Figure 2:
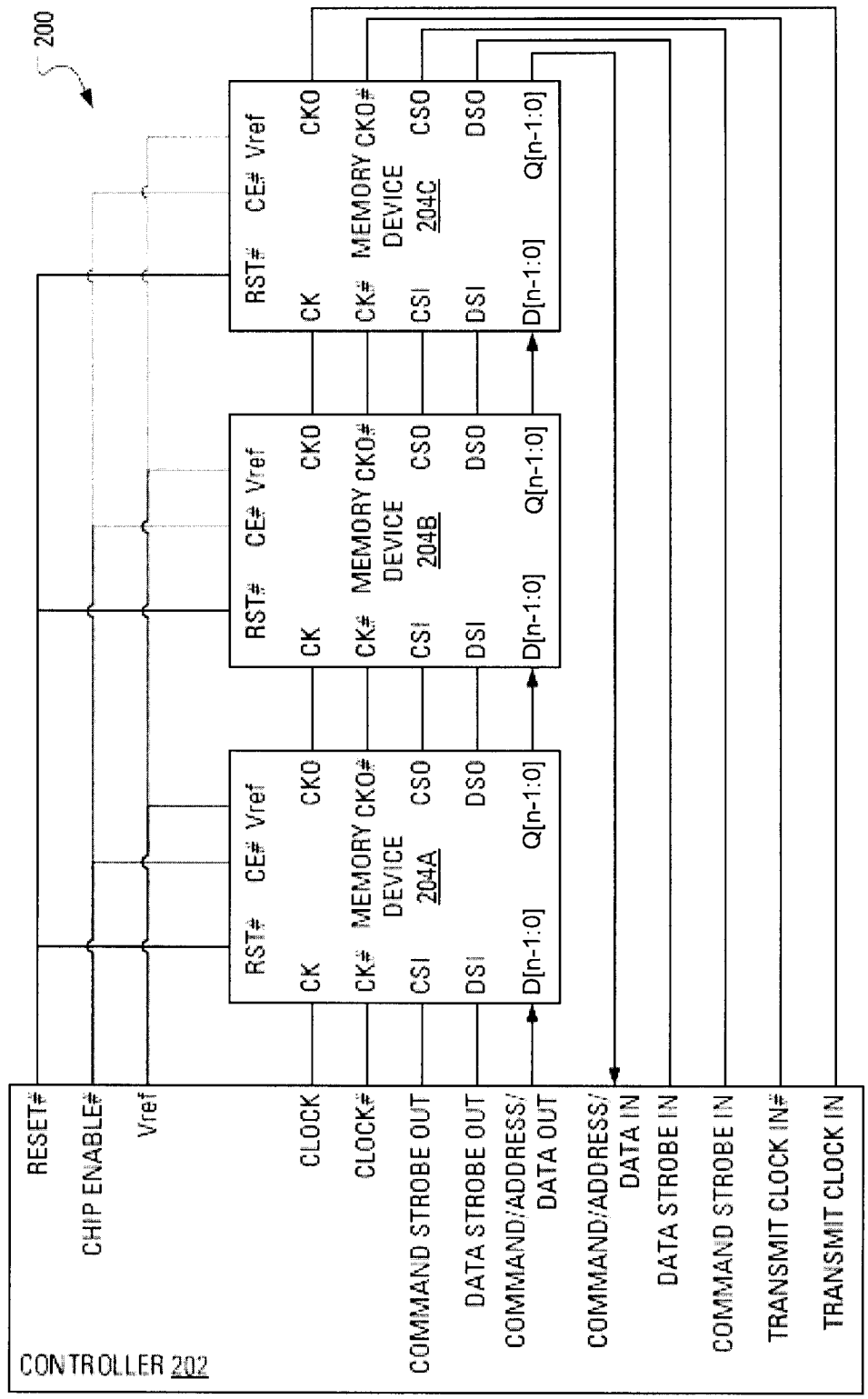
FIG. 2 illustrates a ring arrangement of memory devices configured for source synchronous clock distribution.

An arrangement 200 of memory devices illustrated in FIG. 2 differs from the arrangement 100 of FIG. 1 in that the clock signal CK and its inverse CK# are distributed source synchronously with the strobes and data interface in the arrangement 200 of FIG. 2, whereas these signals are distributed in a parallel manner in the arrangement 100 of FIG. 1. Other structures and arrangements for providing the connections other than the commands and should be apparent to a person skilled in the art. The remaining connections are similar to those shown in FIG. 1, and will not be described in detail.

Figure 3:
FIGS. 3A and 3B illustrate a single memory device from the ring of FIG. 1 or 2 according to a first embodiment, with dual mode operation respectively disabled and enabled.

Referring to FIGS. 3A and 3B, an embodiment of a memory device 304, which may be any of the memory devices 104 or 204, has an eight bit wide Data interface with input pins D[7:0] and output pins Q[7:0]. It should be understood that more or fewer bits may alternatively be used for the Data interface, or that a variable-width Data interface may alternatively be used. The memory device 304 is dynamically configurable to selectively operate in either of a first mode (herein identified as a "normal mode") or a second mode (herein identified as a "dual mode"), as will be described below in further detail.

In FIG. 3A, the memory device 304 is operating in the normal mode, wherein the input pins D[7:0] and the output pins Q[7:0] of the Data interface are used to receive and transmit read/write commands and read/write data in a conventional manner, with each operation (a read or write command with accompanying read or write data where applicable) being communicated between the controller and the memory devices over all of the pins of the data interface. In FIG. 3B, the memory device 304 is operating in the dual mode. In the dual mode, the memory device 304 is configured to treat the pins of the Data interface as two separate ports, as will be described below in further detail. In the illustrated example, the first port includes the four pins D[3:0]/Q[3:0], and the second port includes the four remaining pins D[7:4]/Q[7:4]. In this example, the two ports provide equal bandwidth for two commands each being executed concurrently on one of the ports, as will be described below in further detail. It should be understood that the Data interface pins may alternatively be unequally allocated between the two ports. In general, m of the n pins could be allocated to the first port, such that the first port may include the m pins D[m-1:0]/Q[m-1:0], with the remaining n-m pins D[n-1:m]/Q[n-1:m] being allocated to the second port. The configuration providing equal bandwidth to both ports corresponds to n-m=m. The example of FIG. 3A corresponds to the case of n=8 and m=4. It should additionally be understood that the pin allocation between the first and second ports may be predetermined, or may alternatively be dynamically configurable by the controller 102, for example by specifying the number of pins allocated to each port as part of the command to enter dual mode. In one embodiment disclosed below, one of the ports (the "read interface") is reserved for transmitting read data and the other port (the "write interface") is reserved for transmitting write data. This terminology should not be construed as limiting the potential uses of these ports with respect to either read/write data, or read/write commands.

The memory device 304 can be switched between the normal mode and the dual mode in response to commands received from the controller 102. The commands may be transmitted over either the entire data interface, or a predetermined one of the two ports if the memory device 304 is currently in dual mode, or over a dedicated control pin (for example, the optional Data Mode pin shown in FIGS. 3A, 3B) using a control signal. Using a dedicated pin reduces decoder complexity and saves data interface bandwidth, but increases the number of pins required. A command transmitted over all or some of the data interface may be transmitted in a standard format, for example a standard HLNAND command format in the case of an HLNAND ring. It is preferred that all memory devices in the ring be configured to operate in the same mode, to simplify data transfer around the ring, in which case a command to switch modes transmitted over the data interface would target all memory devices.

Figure 4:
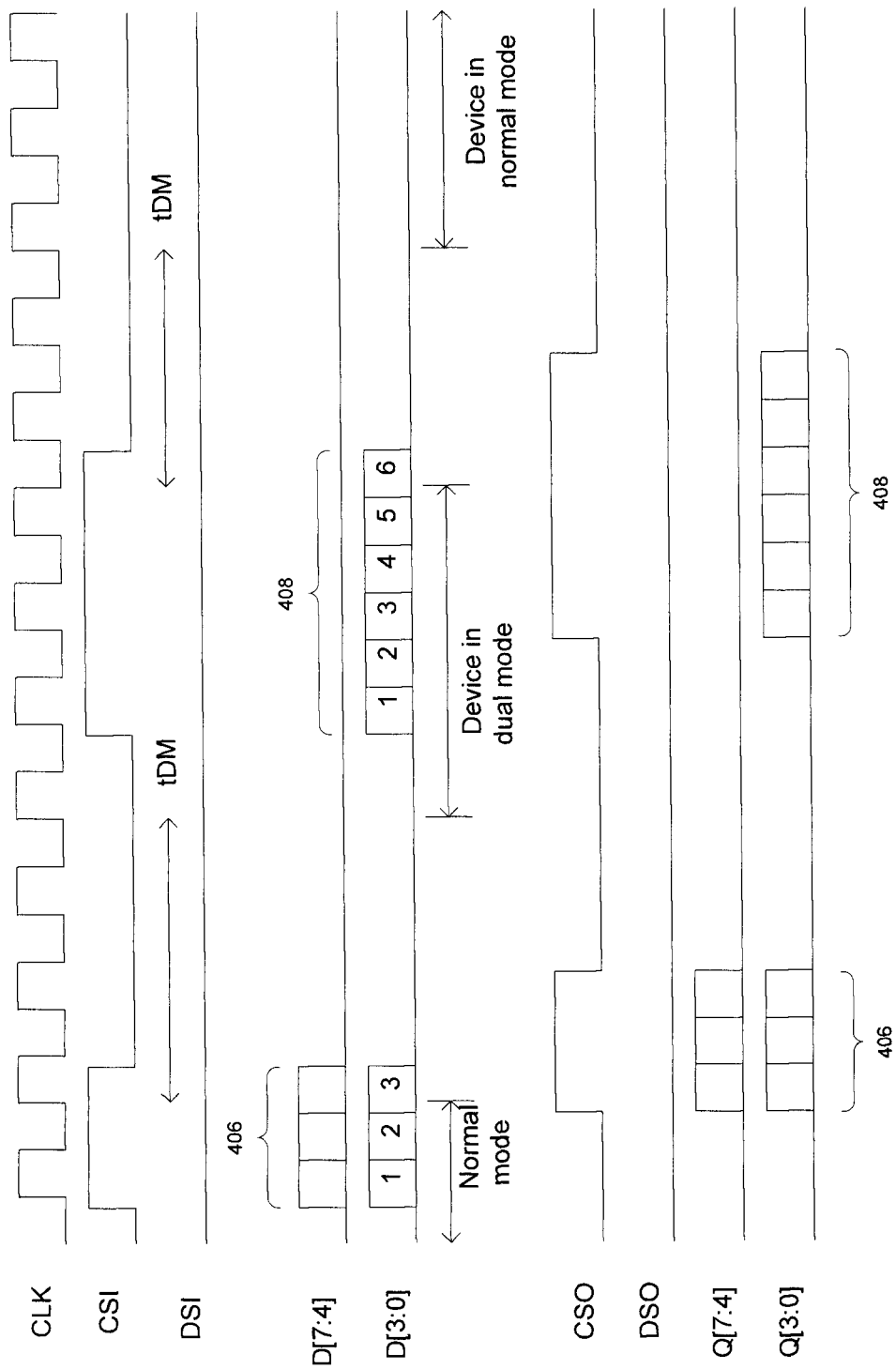
FIG. 4 illustrates a timing diagram for the memory device of FIGS. 3A and 3B switching between normal mode and dual mode operation.

Referring now to FIG. 4, a timing diagram illustrates the switching of a memory device 304 between normal mode and dual mode according to one embodiment, beginning in normal mode. The command 406 to enable dual mode is sent to the memory devices 304 on the entire bandwidth of the data interface, via all eight input pins D[7:0] and all eight output pins Q[7:0] of each device. In this example, the command contains three bytes, and as a result it is transmitted over three clock edges (1½ clock cycles at DDR). It is contemplated that longer or shorter commands 406 may be used, depending on the configuration of the memory devices 304 and whether additional information is transmitted with the command 406, such as the pin allocation between the two ports, which of the ports will be assigned to carry read or write data, or one or more bytes of error detection code (EDC). It is further contemplated that the command 406 may alternatively be sent on a separate control pin. The command 406 is preferably addressed to all of the memory devices 304 in the ring. After a memory device 304 receives the command 406 to switch to dual mode, there is a latency time tDM during which the ring remains idle while the memory device 304 reconfigures its interface and control logic to operate in dual mode. The latency time tDM may vary according to the specifications of the ring, but will generally be on the order of a few clock cycles. Subject to this latency, the memory devices 304 may be switched between normal mode and dual mode at any time, to obtain a desired level of performance and versatility from the memory devices 304. After the end of the latency time tDM, the memory device 304 operates in dual mode until a command 408 to enter normal mode is received, as will be described below in further detail.

When the ring is operating in dual mode and a normal mode of operation is desired, a command 408 to disable dual mode is sent to the memory device 304. In the example of FIG. 4, the command 408 is sent on only one of the two available input and output ports, specifically the four write interface pins corresponding to the D[3:0] and Q[3:0] ports, and as a result the 3-byte command 408 must be transmitted over six clock edges (three clock cycles at DDR). It should be understood that the command 408 may take more or fewer clock cycles depending on the number of pins allocated to the port on which the command 408 is transmitted. It is contemplated that the command 408 may alternatively be transmitted in any suitable manner, for example over the read interface pins D[7:4]/Q[7:4], or over the entire data interface, or via one or more dedicated control pins, provided that the memory device 304 is configured with the necessary logic to respond to commands transmitted in that manner. After the memory device 304 receives the command 408 to switch to normal mode, there is again a latency time tDM during which the ring remains idle while the memory device 304 reconfigures its interface and control logic to operate in normal mode. After the end of the latency time tDM, the memory device 304 operates in normal mode until a further command to enter dual mode is received.

Figure 5:
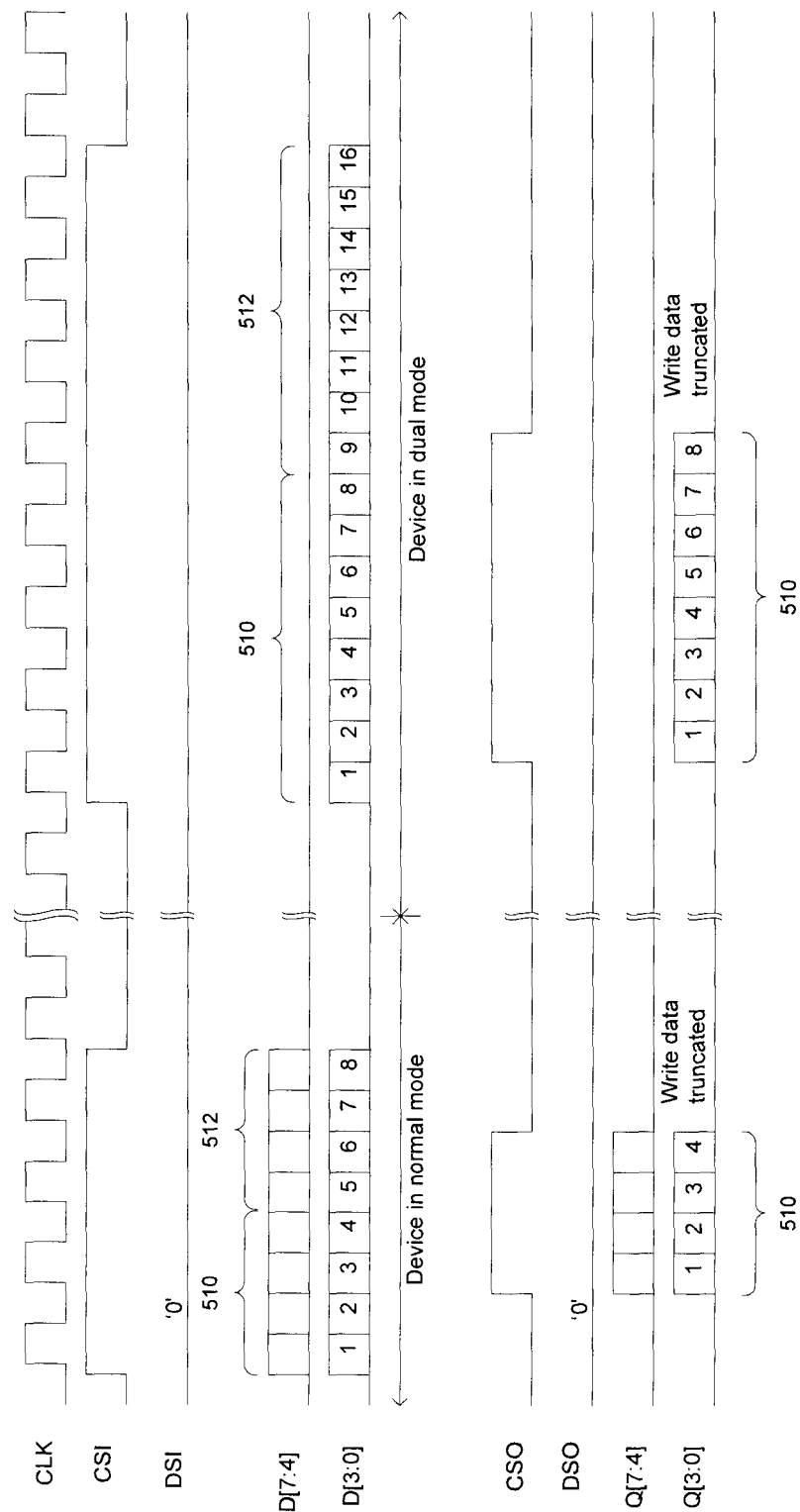
FIG. 5 illustrates a timing diagram for the memory device of FIGS. 3A and 3B receiving a write command in both normal mode and dual mode operation.

Referring now to FIG. 5, a timing diagram illustrates an embodiment of a write command 510 received by a target memory device 304 in both normal mode (left portion) and dual mode (right portion). In the normal mode, a write operation consisting of a four-byte write command 510 and four bytes of write data 512 are received on the full 8-bit bandwidth D[7:0] of the input data interface, over a total duration of eight clock edges. It should be understood that one or both of the write command 510 and the write data 512 could vary in size, in which case correspondingly more or fewer clock edges would be needed to transmit either the command 510 or the write data 512 via the data interface. The memory device 304 writes the data 512 to a memory address specified by the write command 510 in a known manner. The memory device 304 then passes the write command 510 to the output data interface Q[7:0], over the course of four clock edges, and either passes the write data 512 thereafter or optionally truncates the write data 512 in a known manner, with a corresponding truncation of the command strobe CSO.

In the dual mode, a four-byte write command 510 and four bytes of write data 512 are received on the D[3:0] port (the write interface) of the input data interface, over a total duration of sixteen clock edges. It should be understood that one or both of the write command 510 and the write data 512 could vary in size, and the number of pins allocated to the write interface could vary, in which case correspondingly more or fewer clock edges would be needed to transmit either the write command 510 or the write data 512 via the write interface. The memory device 304 writes the data 512 to a memory address specified by the write command 510 in a known manner. The memory device 304 then passes the write command 510 to the output write interface Q[3:0], over the course of eight clock edges, and either passes the write data 512 thereafter or optionally truncates the write data 512 in a known manner, with a corresponding truncation of the command strobe CSO. While the write operation requires more clock edges to complete in dual mode than in normal mode, only the D[3:0] port is used, leaving the D[7:4] port available to concurrently perform a different read or write operation, as will be discussed below in further detail.

Figure 6:
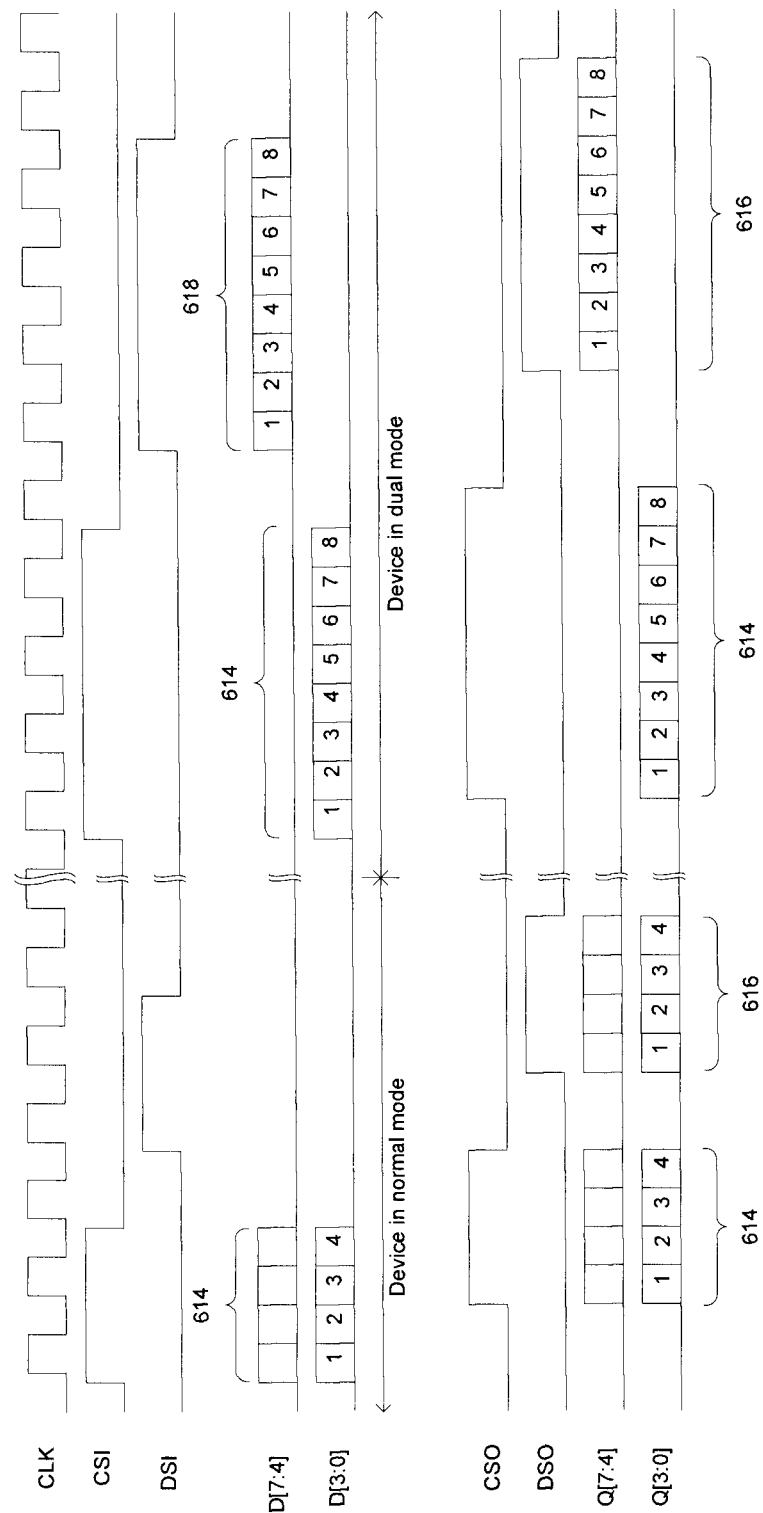
FIG. 6 illustrates a timing diagram for the memory device of FIGS. 3A and 3B receiving a read command in both normal mode and dual mode operation.

Referring now to FIG. 6, a timing diagram illustrates an example of a read command 614 received by a target memory device 304 in both normal mode (left portion) and dual mode (right portion). In the normal mode, a read operation consisting of a four-bit read command 614 is received on the full bandwidth D[7:0] of the input data interface, over a duration of four clock edges. After allowing a latency period for the data 616 to be transferred from the internal storage of the target memory device 304, a high value is transmitted on the data strobe DSI for a duration of four clock edges, corresponding to the quantity of data 616 to be read. It should be understood that one or both of the read command 614 and the read data 616 could vary in size, in which case correspondingly more or fewer clock edges would be needed to transmit either the read command 614 or the data strobe signal DSI. It is contemplated that the read command 614 may optionally be accompanied by null data 618 to be replaced by an equal quantity of data 616 to be read from the target memory device 304. The memory device 304 reads the data 616 from a memory address specified by the write command 614 in a known manner, and outputs the read operation consisting of both the read command 614 and the read data 616 on the entire output data interface Q[7:0], over the course of eight clock edges.

In the dual mode, a four-bit read command 614 is received on the D[3:0] port (the write interface) of the input data interface, over a total duration of eight clock edges, and after a latency period the data strobe DSI assumes a high value for eight clock edges. The read command 614 may optionally be accompanied by null data 618 on the read interface D[7:4] to be replaced by an equal quantity of data 616 to be read from the target memory device 304. It should be understood that one or both of the read command 614 and the read data 616 could vary in size, and the number of pins allocated to the read and write interfaces could vary, in which case correspondingly more or fewer clock edges would be needed to transmit either the read command 614, the data strobe signal DSI, or the null data 618. The memory device 304 reads the specified quantity of data 616 from a memory address specified by the read command 614 in a known manner. The memory device 304 then outputs the read command 614 to the output write interface on the Q[3:0] port, over the course of eight clock edges, and outputs the read data 616 to the output read interface on the Q[7:4] port, over the course of eight clock edges.

Figure 7:
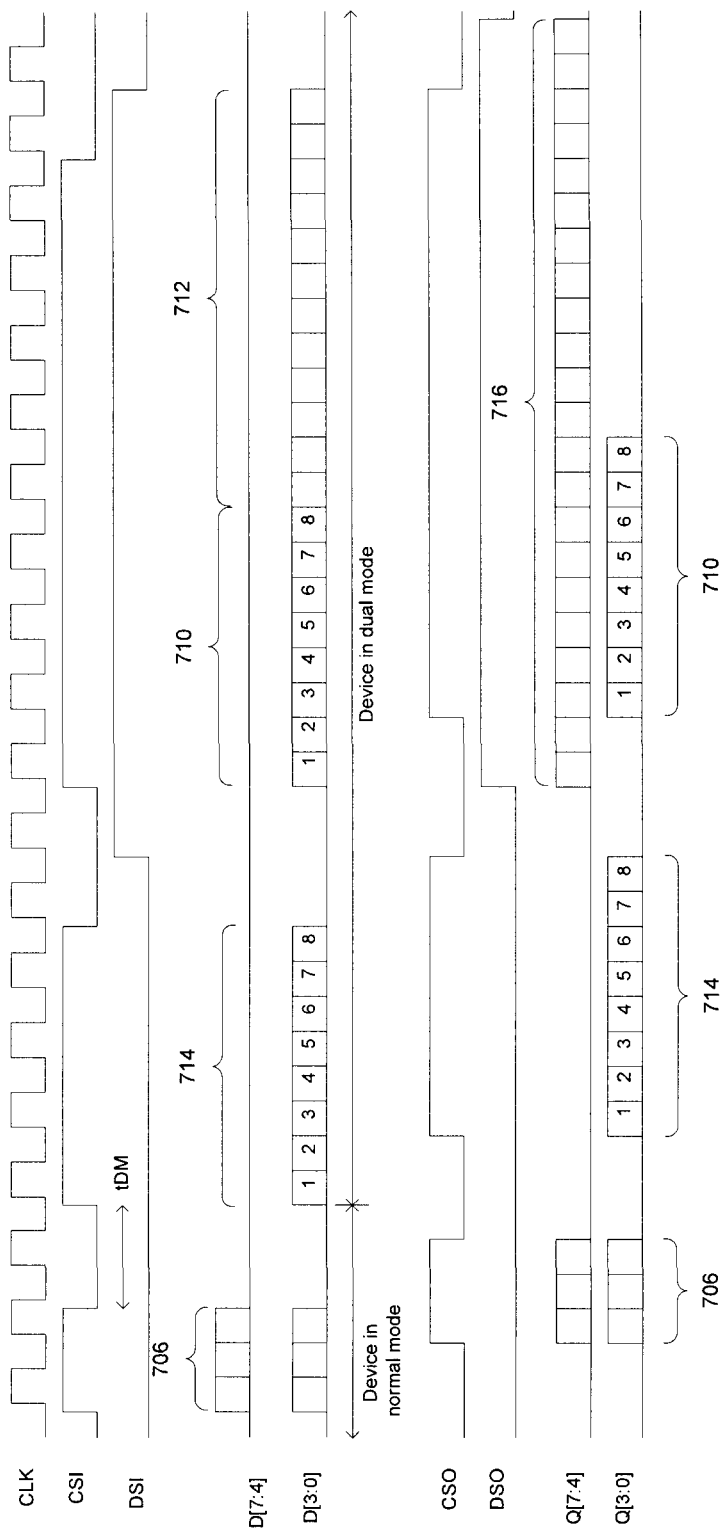
FIG. 7 illustrates a timing diagram for the memory device of FIGS. 3A and 3B receiving read and write commands in both normal mode and dual mode operation.
Figures 8A, 8B:
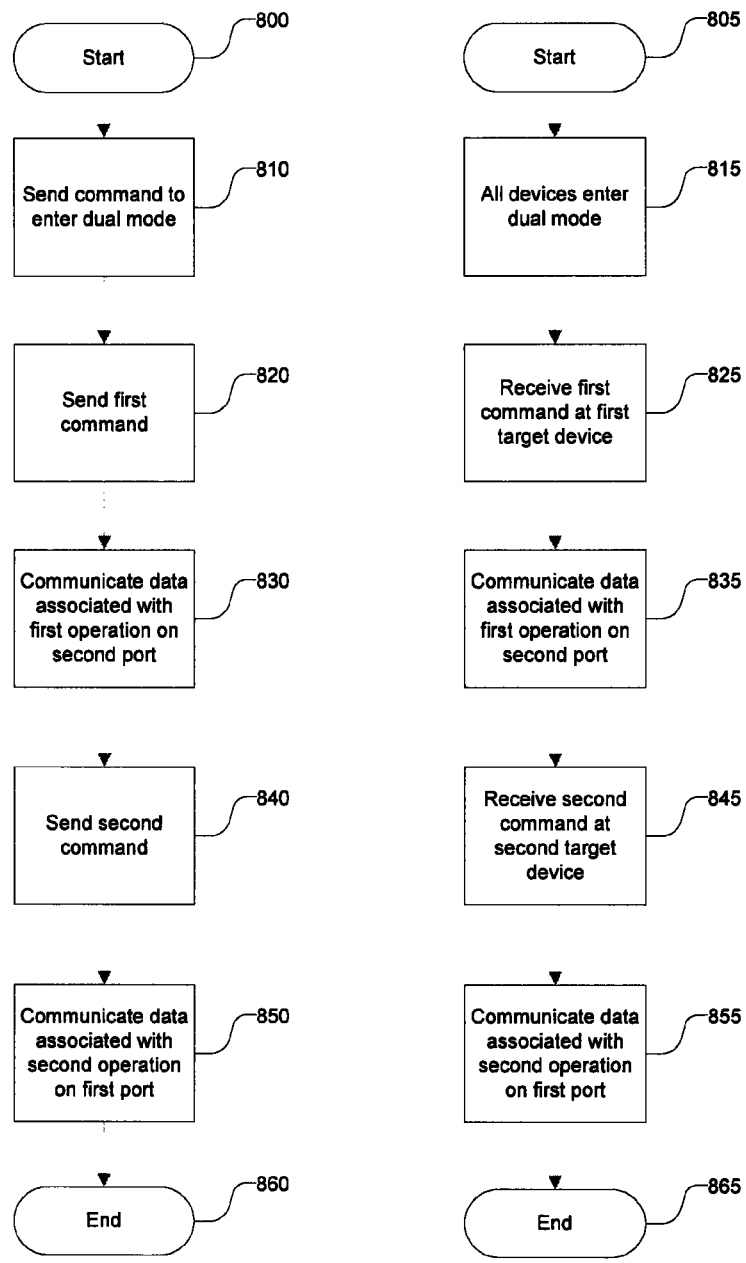
FIG. 8A illustrates a logic diagram for a controller operating a serially-connected array of memory devices.
FIG. 8B illustrates a logic diagram for a serially-connected array of memory devices.

Referring to FIGS. 7, 8A and 8B, a method will be described by which the dual mode of operation of a memory system allows concurrent read and write operations to be performed. While the read and write operations will be described with reference to a single memory device, it should be understood that the read and write operations could similarly target different memory devices in the memory system, irrespectively of whether the read target device is upstream or downstream of the write target device. The controller of the memory system is initially in the normal mode at 800 (FIG. 8A), and the memory device is initially in normal mode at 805 (FIG. 8B).

A command 706 is transmitted by the controller at 810 and received by the memory device at 815 to cause the memory device to enter the dual mode of operation, as described above with respect to FIG. 4. It should be understood that the command 706 is not required if the memory device is already in dual mode.

A first command, for example a read command 714, is transmitted by the controller at 820 and received by the target memory device at 825 on the write interface D[3:0]/Q[3:0], accompanied in the usual manner by the appropriate data strobe signal. It should be understood that the first command 714 may alternatively be communicated over the read interface D[7:4]/Q[7:4], or over a separate dedicated control interface, or in any other suitable manner as described above.

The target memory device processes the read command 714, and then passes the read command 714 to the output write interface Q[3:0]. The target memory device outputs the read data 716 on the output read interface Q[7:4] at 835. The read data 716 is transmitted around the ring in a known manner until it is received by the controller on the input read interface D[7:4] at 830.

A second command, for example a write command 710, is transmitted by the controller at 840 and received by the target memory device at 845 on the write interface D[3:0]/Q[3:0], accompanied at 850/855 by the data 712 to be written to the target memory device. The target memory device of the write command proceeds to write the data 712 to its internal buffer for later transfer to its internal memory, in a known manner.

Figure 10:
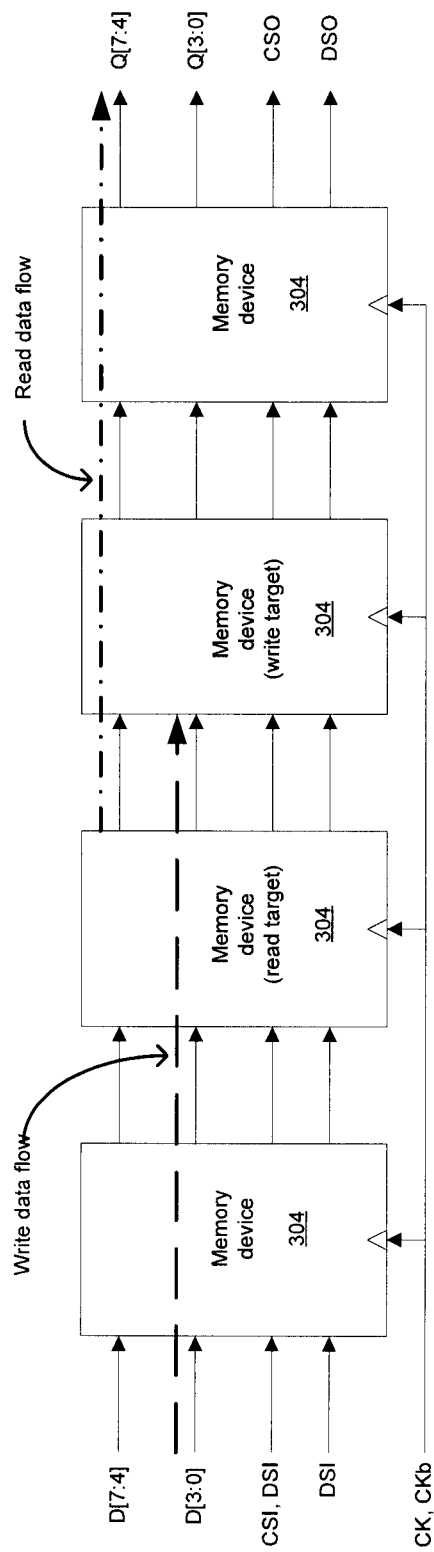
FIG. 10 illustrates a segment of a ring arrangement of memory devices in dual mode operation according to a further embodiment, where a write operation occurs downstream of a concurrent read operation.
Figure 11:
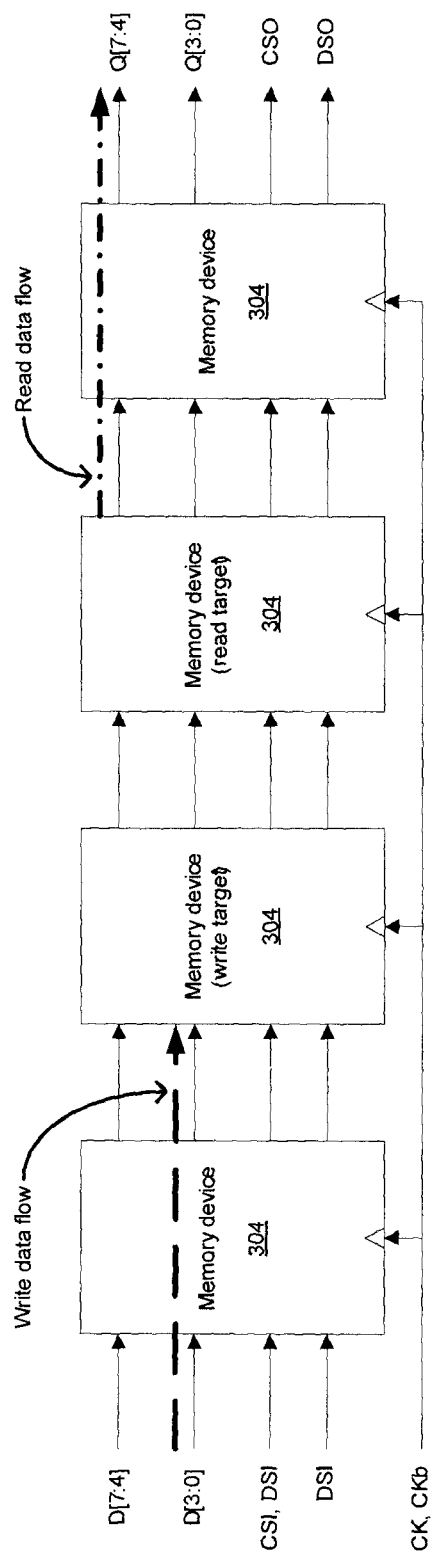
FIG. 11 illustrates a segment of a ring arrangement of memory devices in dual mode operation according to a further embodiment, where a write operation occurs upstream of a concurrent read operation.

The memory device passes the write command 710 to the output write interface D[3:0], optionally at the same time as the read data 716 is output to the output read interface Q[7:4]. The memory device addressed by the write command 710 optionally truncates the write data 712 accompanying the write command 710. It should be understood that the memory device may concurrently output read data 716 and write commands 710 and/or write data 712, for example if either operation targets a downstream memory device, because the read data 716 is output on the Q[7:4] port while write commands 710 and write data 712 are output on the Q[3:0] port, as illustrated in FIG. 7. In this manner, read and write data can be communicated between the controller and any target devices without bus contention, regardless of whether the read target is upstream of the write target (as seen in FIG. 10) or downstream of the write target (as seen in FIG. 11), or even if both targets are the same device.

The process ends at 860 and 865, with the controller optionally sending a command (not shown) to cause the memory device to revert to normal mode, so that the full bandwidth of the data interface can be used by a single read or write operation. The controller may alternatively allow the memory device to remain in dual mode if a requirement to concurrently process subsequent read or write operations is anticipated.

It should be understood that one or more memory devices may be arranged downstream of a read target and also upstream of a concurrent write target, in which case those one or more memory devices could pass both read and write data concurrently from their input to their output. It should further be understood that the two concurrent operations could alternatively either both be read operations or both be write operations, for example targeting two different memory devices.

In the embodiment of FIGS. 7, 8A and 8B, read and write commands are both transmitted on the write data interface while the system is in dual mode. It should be understood that alternative arrangements are possible provided that the memory device is appropriately configured with the necessary logic to process the commands, for example additional command strobe signals. Possible alternative arrangements include: transmitting all commands on the read data interface; transmitting read commands on the read data interface and write commands on the write data interface; or transmitting both read and write commands on a separate dedicated interface such as one or more dedicated command pins. For example, if the commands are alternatively all transmitted on the read interface, the order of the operations could be reversed (initiating the write operation first and the read operation second) to obtain concurrent read and write operations. In general, it is preferable to first initiate an operation on a port that does not transmit commands, so that a second command for initiating a second operation can be more easily sent. However, regardless of the order in which the operations are initiated, it should be understood that a second operation can be initiated by interrupting an ongoing data transfer for only the duration of the second command, and neither operation needs to be delayed while the potentially large quantity of data associated with the other operation is completely transmitted, because the data associated with both operations can be transmitted concurrently on the separate interfaces. As a result, any two operations can be initiated in any order, and in particular either operation can be initiated at any time during the processing of the data associated with the other operation.

Figure 9:
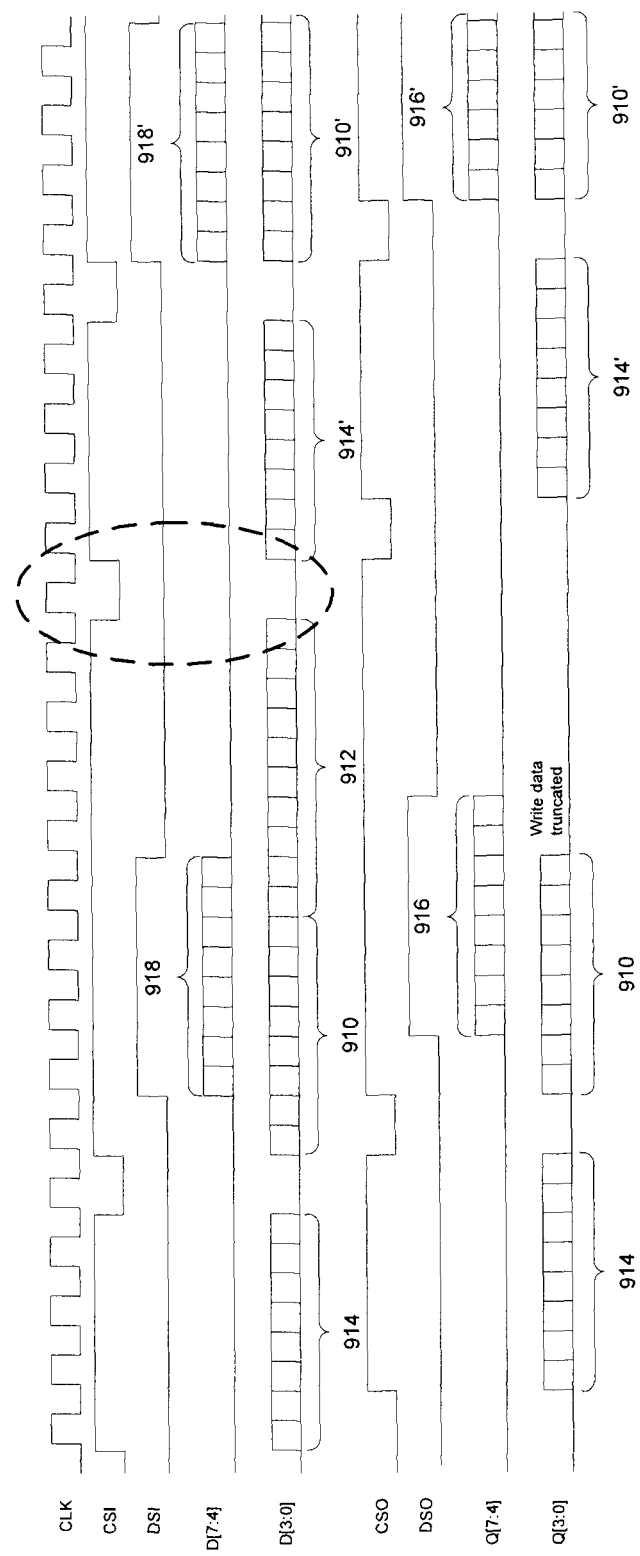
FIG. 9 illustrates a timing diagram for the memory device of FIGS. 3A and 3B performing two successive read operations.

Referring to FIG. 9, it should be understood that a read command 914 can only be so transmitted on the write data interface when the write data interface is not being occupied by the transmission of a write command 910 or write data 912. As a result, if a second read operation 914' is desired, either the second read command 914' must be transmitted other than via the write interface (as described above), or any write operation 910, 912 currently being processed must first be either truncated (represented by the dashed oval in FIG. 9) or completed. Similarly, if read and write commands are ordinarily transmitted on the read data interface, a new write command can only be transmitted if there is no read command in progress on the read data interface, and any previous read command must be truncated or completed before transmitting the command, or else the write command must be transmitted other than via the read interface. It should be understood that any truncated write operation 910, 912 may be resumed at 910' after the read command 914' is communicated, even while the data 916' associated with the read command 914' is still being communicated. Alternatively, read and write commands can be processed completely independently of each other if read commands are transmitted on the read data interface and write commands are transmitted on the write data interface, provided that the memory devices are configured with the necessary logic to allow the memory device to process commands received on two different interfaces.

In this manner, it should be understood that a serially connected memory system can perform two concurrent operations. In particular, a serially connected memory system can perform concurrent read and write operations, irrespective of the physical locations in the ring of the read and write target devices.

Modifications and improvements to the above-described embodiments of the present invention may become apparent to those skilled in the art. The foregoing description is intended to be by way of example rather than limiting. The scope of the present invention is therefore intended to be limited solely by the scope of the appended claims.

The invention claimed is:

1. A memory system comprising:
 a controller; and
 a plurality of memory devices serially interconnected with the controller via an n-bit data interface,
 the memory system being configurable in a first mode to communicate each read and write operation between the controller and the memory devices using all n bits of the data interface;
 the memory system being configurable in a second mode to concurrently:
  communicate data associated with a first operation between the controller and a first target memory device using only m bits of the data interface, where m is less than n; and communicate data associated with a second operation between the controller and a second target memory device using the remaining n-m bits of the data interface.

2. The memory system of claim 1, wherein:
the first operation is a read operation; and
the second operation is a write operation.

3. The memory system of claim 2, wherein the second target memory device is connected downstream of the first target memory device.

4. The memory system of claim 2, wherein m and n-m are equal.

5. The memory system of claim 2, wherein the controller is further configurable in the second mode to communicate commands associated with the first and second operations on only the remaining n-m bits of the data interface.

6. A memory device comprising:
n data input pins for receiving data from a first external device;
n data output pins for transmitting data to a second external device; and
internal logic selectively configurable to operate the memory device in one of a first mode and a second mode,
when operating in the first mode, the memory device being operative to:
receive data associated with a single operation on all n data input pins; and
transmit data associated with a single operation on all n data output pins; and
when operating in the second mode, the memory device being operative to concurrently:
receive data associated with a first operation on only m of the data input pins;
transmit data associated with the first operation on only m of the data output pins;
receive data associated with a second operation on the remaining n-m of the data input pins; and
transmit data associated with the second operation on the remaining n-m of the data output pins,
where m is less than n.

7. The memory device of claim 6, wherein:
the first operation is a read operation; and
the second operation is a write operation.

8. The memory device of claim 7, wherein:
a target device of the write operation is connected downstream of the data output pins; and
a target device of the read operation is connected upstream of the data input pins.

9. The memory device of claim 7, wherein m and n-m are equal.

10. The memory device of claim 7, wherein:
the internal logic is further configurable in the second mode to receive commands associated with the first and second operations on only the remaining n-m data input pins.

11. A memory controller, comprising:
an n-bit data interface for communicating with a plurality of serially-connected memory devices; and
internal logic configurable to operate in a first mode to communicate each read and write operation to the memory devices using all n bits of the data interface;
the memory controller being configurable in a second mode to concurrently:
communicate data associated with a first operation to the memory devices using only m bits of the data interface, where m is less than n; and
communicate data associated with a second operation to the memory devices using the remaining n-m bits of the data interface.

12. The memory controller of claim 11, wherein:
the first operation is a read operation; and
the second operation is a write operation.

13. The memory controller of claim 12, wherein a target memory device of the write operation is connected downstream of a target memory device of the read operation.

14. The memory controller of claim 12, wherein m and n-m are equal.

15. The memory controller of claim 12, being further configurable in the second mode to communicate commands associated with the first and second operations on only the remaining n-m bits of the data interface.

16. A method of operating a plurality of serially-connected memory devices connected by an n-bit data interface, the method comprising:
sending a first command from a memory controller, the first command being addressed to a first target memory device;
communicating data associated with the first command between the memory controller and the first target memory device on only m bits of the data interface;
sending a second command from the memory controller, the second command being addressed to a second target memory device; and
communicating data associated with the second command between the memory controller and the second target memory device on only the remaining n-m bits of the data interface.

17. The method of claim 16, wherein communicating data associated with the first command and communicating data associated with the second command are performed concurrently.

18. The method of claim 17, wherein communicating data associated with the first command and sending the second command are performed concurrently.

19. The method of claim 18, wherein:
the first and second commands are sent using only the remaining n-m bits of the data interface.

20. The method of claim 16, wherein:
one of the first and second commands is a read command, and the other of the first and second commands is a write command.

21. The method of claim 20, wherein:
the target memory device of the write command is connected downstream of the target memory device of the read command.

22. The method of claim 20, wherein m is equal to n-m.

* * * * *